United States Patent
Goto et al.

(10) Patent No.: US 10,539,622 B2
(45) Date of Patent: Jan. 21, 2020

(54) INSPECTION METHOD AND MANUFACTURING METHOD FOR ELECTRIC POWER STORAGE DEVICE

(71) Applicant: TOYOTA JIDOSHA KABUSHIKI KAISHA, Toyota-shi, Aichi-ken (JP)

(72) Inventors: Takeshi Goto, Kasugai (JP); Kiwamu Kobayashi, Anjo (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 5 days.

(21) Appl. No.: 16/034,461

(22) Filed: Jul. 13, 2018

(65) Prior Publication Data
US 2019/0041466 A1    Feb. 7, 2019

(30) Foreign Application Priority Data
Aug. 7, 2017  (JP) .................................. 2017-152309

(51) Int. Cl.
*G01N 27/416*    (2006.01)
*G01R 31/36*    (2019.01)
(Continued)

(52) U.S. Cl.
CPC ....... *G01R 31/3648* (2013.01); *G01R 31/382* (2019.01); *G01R 31/3842* (2019.01);
(Continued)

(58) Field of Classification Search
CPC ............... H01M 10/48; H01M 10/486; H01M 2220/20; H01M 10/425; G01R 31/382;
(Continued)

(56) References Cited

U.S. PATENT DOCUMENTS

2016/0105044 A1* 4/2016 Yamaguchi ........... H02J 7/0016
                                                           320/112
2016/0318417 A1* 11/2016 Suzuki ................ H01M 10/486
2019/0011502 A1*  1/2019 Kobayashi ......... G01R 31/3865

FOREIGN PATENT DOCUMENTS

JP         2010-153275 A     7/2010
JP         2013-165029 A     8/2013

OTHER PUBLICATIONS

U.S. Appl. No. 16/013,421, Kiwamu Kobayashi et al., filed Jun. 20, 2018.

* cited by examiner

*Primary Examiner* — Raul J Rios Russo
(74) *Attorney, Agent, or Firm* — Sughrue Mion, PLLC

(57) ABSTRACT

An external electric power supply is connected to a charged electric power storage device in a reverse voltage direction to form a circuit. A voltage of the external electric power supply is adjusted such that a current does not flow immediately after the connection. Then, current measuring of acquiring a converged current value of the current in the circuit due to a decrease in the voltage of the electric power storage device, and quality deciding based on the converged current value are performed. Before the quality deciding, the electric power storage device is grouped such that the converged current value of when the electric power storage device is a normal product is constant in a group. In the quality deciding, a degree of variation in the converged current value is calculated for each group, and the quality is determined by comparing the calculated degree of variation with its predetermined level.

7 Claims, 6 Drawing Sheets

(51) Int. Cl.
*H01M 10/44* (2006.01)
*H01M 10/48* (2006.01)
*G01R 31/385* (2019.01)
*H01M 10/42* (2006.01)
*G01R 31/3842* (2019.01)
*G01R 31/392* (2019.01)
*G01R 31/382* (2019.01)
*G01R 31/3835* (2019.01)

(52) U.S. Cl.
CPC ....... *G01R 31/3865* (2019.01); *G01R 31/392* (2019.01); *H01M 10/425* (2013.01); *H01M 10/446* (2013.01); *H01M 10/48* (2013.01); *H01M 10/486* (2013.01); *G01R 31/3835* (2019.01); *H01M 2220/20* (2013.01)

(58) Field of Classification Search
CPC .............. G01R 31/3835; G01R 31/392; G01R 31/3842
USPC ............................ 324/76.11–76.83, 425, 426
See application file for complete search history.

INSPECTION METHOD AND MANUFACTURING METHOD FOR ELECTRIC POWER STORAGE DEVICE

INCORPORATION BY REFERENCE

The disclosure of Japanese Patent Application No. 2017-152309 filed on Aug. 7, 2017 including the specification, drawings and abstract is incorporated herein by reference in its entirety.

BACKGROUND

1. Technical Field

The present disclosure relates to an inspection method for determining the quality of an electric power storage device. More specifically, the disclosure relates to an inspection method for an electric power storage device for promptly performing quality determination based on the amount of discharge current of the electric power storage device without using the amount of decrease in voltage. The disclosure also relates to a manufacturing method for an electric power storage device that includes the inspection method for an electric power storage device as a step.

2. Description of Related Art

Various inspection methods for determining the quality of a secondary battery or other electric power storage devices have been suggested in the related art. For example, in Japanese Unexamined Patent Application Publication No. 2010-153275 (JP 2010-153275 A), a leaving step in which a secondary battery as a determination target is left in a pressurized state is performed, and the battery voltage is measured before and after the leaving step. The difference in battery voltage before and after the leaving step is the amount of decrease in voltage accompanied by leaving the secondary battery. A battery having a large amount of decrease in voltage has a large self-discharge amount. Thus, the quality of the secondary battery can be determined using the magnitude of the amount of decrease in voltage. Such an inspection method is performed as one step in a manufacturing method.

SUMMARY

The quality determination of the secondary battery in the related art poses the following problem. The quality determination of the secondary battery takes time. The reason for the time taken in the quality determination of the secondary battery is that the amount of decrease in voltage has significance only when a long amount of leaving time is secured in the leaving step. One cause is a contact resistance in voltage measurement. Voltage measurement is performed by connecting a measuring instrument between both terminals of the secondary battery. At such a time, a contact resistance is inevitably present between a terminal on the secondary battery side and a terminal on the measuring instrument side, and the contact resistance affects the measurement result. The contact resistance varies each time the terminal on the secondary battery side is connected to the terminal on the measuring instrument side. Thus, variations in contact resistance at each measurement cannot be ignored unless the amount of decrease in voltage is large to a certain degree.

The accuracy of voltage measurement is also low. The reason is that the voltage measurement is affected by a decrease in voltage on the electrical conduction path at the time of measurement; and the degree of decrease in voltage also varies at each measurement since the location of contact between the terminal on the secondary battery side and the terminal on the measuring instrument side slightly varies in each connection. Using current measurement instead of voltage measurement is considered in order to reduce the measurement time for the self-discharge amount and improve the measurement accuracy. Since a current is constant in any location in a circuit, the current measurement is rarely affected by the location of contact unlike the voltage measurement. However, simply changing the voltage measurement to the current measurement does not enable favorable determination. The reason is that the measurement result depends on variations in conditions such as the charging voltage and the measurement environment of the secondary battery.

The disclosure provides an inspection method and a manufacturing method for an electric power storage device for promptly performing quality determination of the electric power storage device regardless of variations in conditions.

A first aspect of the disclosure relates to an inspection method for an electric power storage device. The inspection method includes: current measuring of i) connecting an external electric power supply to a charged electric power storage device in an reverse voltage direction to form a circuit, ii) adjusting a voltage of the external electric power supply such that a current does not flow in the circuit immediately after the connection, and iii) then, acquiring a converged current value of the current flowing in the circuit; quality deciding of deciding a quality of the electric power storage device based on the converged current value acquired in the current measuring; and grouping a target electric power storage device based on a rule that the converged current value of when the target electric power storage device is a normal product is constant in a group. The grouping is performed before the quality deciding of the electric power storage device. The quality deciding of the electric power storage device includes variation calculating of calculating a degree of variation in the converged current value for each group, and determining, in a case where the calculated degree of variation of a group is equal to or lower than a predetermined level, any electric power storage device belonging to the group as a normal product, and determining, in a case where the degree of variation of a group exceeds the predetermined level, at least one electric power storage device having the highest converged current value in the group as a defective product.

In the inspection method according to the first aspect of the disclosure, quality inspection is performed with respect to self-discharge of the electric power storage device. Thus, the circuit is formed with the charged electric power storage device and the external electric power supply, and the voltage of the external electric power supply is adjusted such that a current does not flow in the circuit. Then, the current flows in the circuit along with a decrease in the voltage of the electric power storage device due to the self-discharge, and the current is increased. The magnitude of the current value after the increase is converged is an indicator that indicates the magnitude of self-discharge. Thus, the quality of the electric power storage device can be decided based on the converged current value. Accordingly, in terms of the required processing time and the measurement accuracy, the inspection method is more advantageous than inspection performed by measuring a decrease in the voltage of the electric power storage device.

In the inspection method according to the first aspect of the disclosure, the converged current value of the target electric power storage device is not determined using a uniform reference, and is determined for each group that is grouped in advance. Thus, the rule of grouping is that a group of electric power storage devices having the most similar values of the converged current value of when the electric power storage device is a normal product is formed. By such grouping, the converged current values of normal products among the electric power storage devices in the group are distributed by being concentrated in a very narrow range. When a defective product is present in the group, the converged current value of the defective product is high and stands out compared to the value of the normal product. Thus, accurate determination can be performed by calculating the degree of variation in the converged current value for each group and comparing the calculated degree of variation with the predetermined level. An allowed value of the degree of variation can be set as the predetermined level of the degree of variation. Alternatively, the predetermined level of the degree of variation may be an allowed value that is set for the magnitude of difference between the degree of variation of the whole group and the degree of variation calculated by excluding the highest converged current value from the whole group.

In the inspection method according to the first aspect of the disclosure, the grouping may be performed before the current measuring, and the grouping may be performed based on a voltage value of the electric power storage device before start of the current measuring. The reason is that the voltage value of the electric power storage device before the start of the current measuring, that is, the initial voltage value of the electric power storage device, is correlated with the converged current value. By performing such grouping, the degree of variation in the converged current values of normal products in the group can be decreased. The determination accuracy is also improved.

In the inspection method according to the first aspect of the disclosure, the grouping using the initial voltage value of the electric power storage device may be performed by connecting positive terminals of a plurality of electric power storage devices to each other and negative terminals of the electric power storage devices to each other, performing an initial voltage equalization process of equalizing the voltage values of the connected electric power storage devices, and forming a group of the electric power storage devices of which the voltage values are equalized by the initial voltage equalization process. Accordingly, the initial voltages of the electric power storage devices in the group can be equalized to a high degree without measuring the initial voltage value of each electric power storage device.

In the inspection method according to the first aspect of the disclosure, the grouping may be performed before the current measuring. In the grouping, a plurality of target electric power storage devices may be loaded on each of inspection racks. The electric power storage devices on the same inspection rack may be grouped. Then, the electric power storage devices may not be moved between the inspection racks. The current measuring may be performed in a state where the electric power storage devices are loaded on each inspection rack for each group. Accordingly, the electric power storage devices in the same group are subjected to the current measuring under almost the same external temperature environment. The external temperature environment in the current measuring is known to affect the converged current value. Thus, the degree of variation in the converged current values of normal products in the group is decreased by managing the groups with the inspection racks. The grouping can also be performed by considering grouping based on the initial voltage value of the electric power storage device and grouping based on the inspection rack. In such a case, a group of electric power storage devices having similar initial voltage values on the same inspection rack is formed.

In the inspection method according to the first aspect of the disclosure, the electric power storage device that incorporates a positive electrode plate and a negative electrode plate may be set as an inspection target, and the grouping may be performed by forming a group of electric power storage devices such that the positive electrode plates of the electric power storage devices in the group belong to the same positive electrode plate manufacturing lot and the negative electrode plates of the electric power storage devices in the group belong to the same negative electrode plate manufacturing lot. The constituent material of the electric power storage device inevitably has a slight difference in characteristics depending on its manufacturing lot. The slight difference in characteristics also affects the converged current value. Particularly, the positive and negative electrode plates tend to affect the converged current value. Thus, by performing the grouping based on such consideration, the degree of variation in the converged current values of normal products in the group can be decreased. The grouping may be performed by considering any two or all of three rules of grouping based on the initial voltage value of the electric power storage device, grouping based on the inspection rack, and grouping based on the manufacturing lot.

In the inspection method according to the first aspect of the disclosure, in the determining, in a case where the degree of variation of a group exceeds the predetermined level, an electric power storage device having the highest converged current value in the group may be determined as a defective product, and the electric power storage device may be excluded from the group. In the quality deciding of the electric power storage device, the variation calculating and the determining may be repeated. By repeating the variation calculating and the determining until the degree of variation of each group becomes equal to or lower than the predetermined level, the quality of all electric power storage devices can be determined.

A second aspect of the disclosure relates to a manufacturing method for an electric power storage device. The manufacturing method includes charging an assembled non-charged electric power storage device to a predetermined charging state for a first time to acquire a charged electric power storage device, and inspecting the charged electric power storage device. In the inspecting of the charged electric power storage device, the inspection method according to any of the aspects is performed.

According to the aspects of the disclosure, the inspection method and the manufacturing method for the electric power storage device for promptly performing quality determination of the electric power storage device regardless of variations in conditions are provided.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
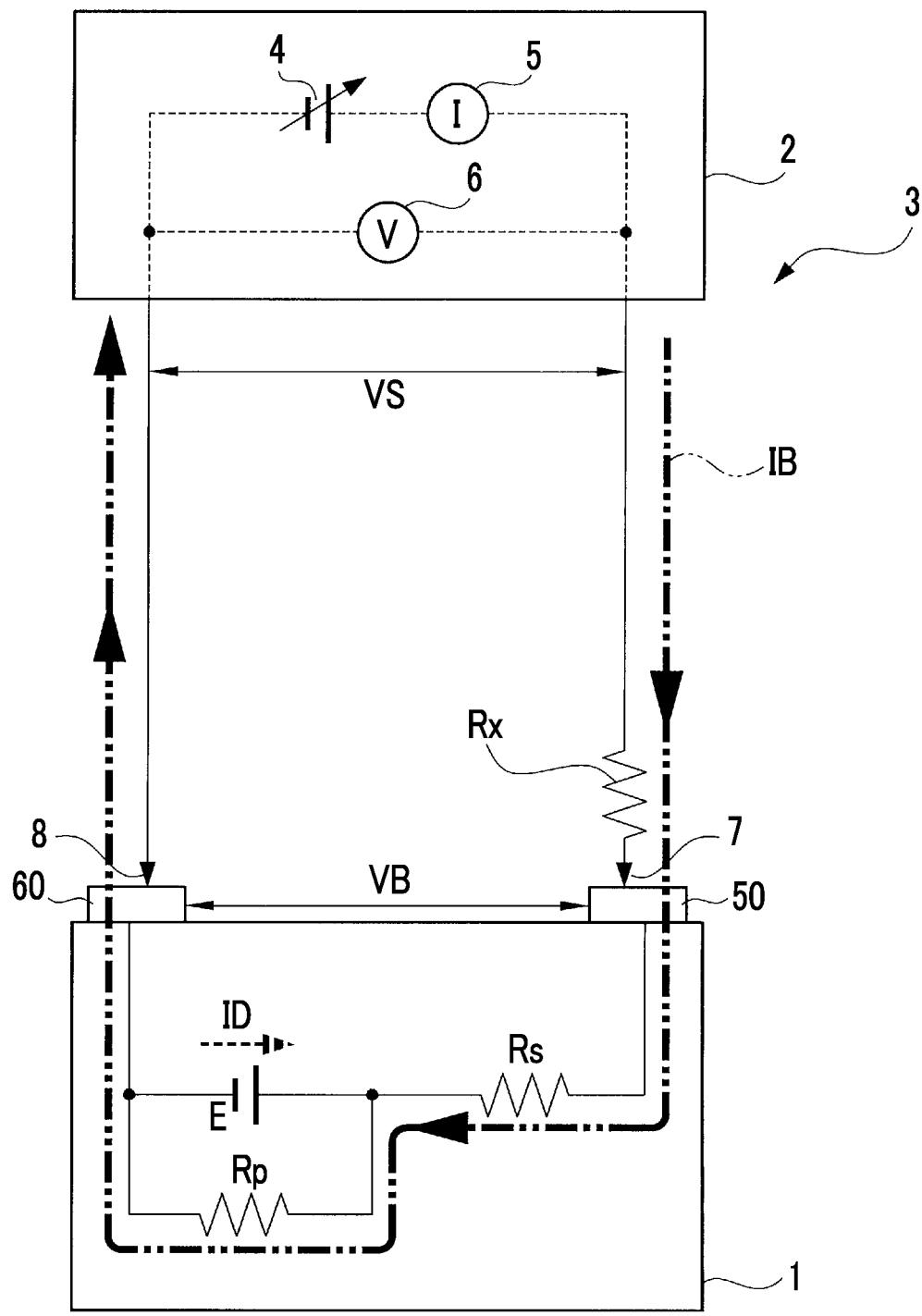
FIG. 1 is a circuit diagram illustrating a configuration of a circuit configured for performing an inspection method for a secondary battery in an embodiment.

Hereinafter, an embodiment of the disclosure will be described in detail with reference to the appended drawings. As illustrated in FIG. 1, an inspection method for an electric power storage device in the embodiment is performed in a state where a circuit 3 is configured by connecting a measuring device 2 to a secondary battery 1 that is the electric power storage device as an inspection target. First, a basic principle of the inspection method for the secondary battery 1 using the measuring device 2 will be described.

Basic Principle

Figure 2:
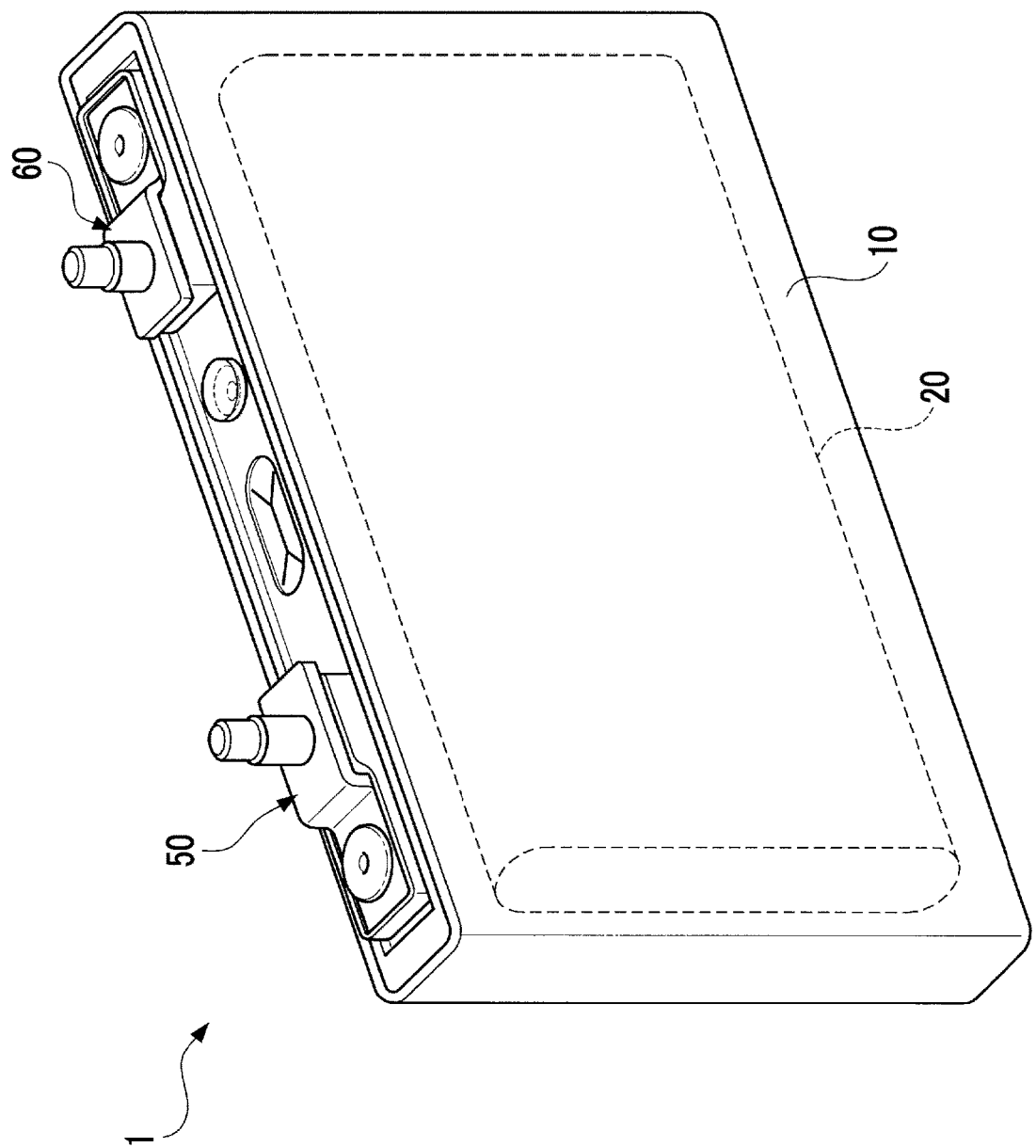
FIG. 2 is an exterior view illustrating an example of the secondary battery as an inspection target in the embodiment.

The secondary battery 1 schematically illustrated in FIG. 1 has an exterior of, for example, a flat cornered shape in actuality as illustrated in FIG. 2. The secondary battery 1 in FIG. 2 is configured by incorporating an electrode laminate 20 in an exterior body 10. The electrode laminate 20 is acquired by stacking a positive electrode plate and a negative electrode plate with a separator therebetween. In addition to the electrode laminate 20, a liquid electrolyte is accommodated in the exterior body 10. Positive and negative terminals 50, 60 are disposed on the outer surface of the secondary battery 1. The shape of the secondary battery 1 is not limited to a flat cornered shape in FIG. 2 and may be another shape such as a cylindrical shape.

FIG. 1 will be described in further detail. In FIG. 1, the secondary battery 1 is schematically illustrated. The secondary battery 1 in FIG. 1 is represented as a model that is configured with an electromotive element E, an internal resistance Rs, and a short-circuit resistance Rp. The internal resistance Rs is disposed in series with the electromotive element E. The short-circuit resistance Rp is a model of an electrical conduction path formed by a minute metallic foreign object that has entered the electrode laminate 20. The short-circuit resistance Rp is disposed in parallel with the electromotive element E.

The measuring device 2 includes a direct current electric power supply 4, an ammeter 5, a voltmeter 6, and probes 7, 8. The ammeter 5 is disposed in series with the direct current electric power supply 4. The voltmeter 6 is disposed in parallel with the direct current electric power supply 4. An output voltage VS of the direct current electric power supply 4 is variable. The direct current electric power supply 4 is used for applying the output voltage VS to the secondary battery 1 as described below. The ammeter 5 measures the current flowing in the circuit 3. The voltmeter 6 measures the voltage between the probes 7, 8. In FIG. 1, the circuit 3 is configured by coupling the probes 7, 8 of the measuring device 2 to the terminals 50, 60 of the secondary battery 1. A parasitic resistance Rx is present in the circuit 3 in FIG. 1. The parasitic resistance Rx includes a wire resistance in each unit of the measuring device 2 and also contact resistances between the probe 7 and the terminal 50, and the probe 8 and the terminal 60.

In the inspection method using the measuring device 2, the magnitude of the self-discharge amount of the secondary battery 1 is inspected. When the self-discharge amount is large, the secondary battery 1 is defective. When the self-discharge amount is small, the secondary battery 1 is normal. Thus, first, the secondary battery 1 is charged before being connected to the circuit 3. Then, the charged secondary battery 1 is connected to the circuit 3, and the self-discharge amount of the secondary battery 1 is calculated by the measuring device 2 in the connected state. Then, the quality of the secondary battery 1 is determined based on the calculation result.

Specifically, the charged secondary battery 1 is connected to form the circuit 3. The charged secondary battery 1 to be connected to form the circuit 3 has a stabilized battery voltage after high-temperature aging that is typically performed after charging. It should be noted that the inspection in the embodiment is performed at room temperature. After the secondary battery 1 is connected to form the circuit 3, first, the output voltage VS of the measuring device 2 is adjusted such that the read value of the ammeter 5 becomes zero. At such a time, the output voltage VS matches an initial battery voltage VB1 that is the initial value of a battery voltage VB of the secondary battery 1.

In the above state, the output voltage VS matches the initial battery voltage VB1, and the output voltage VS and the battery voltage VB of the secondary battery 1 are in reverse direction. Thus, both voltages cancel each other out, and a circuit current IB of the circuit 3 becomes zero. The secondary battery 1 is left while the output voltage VS of the measuring device 2 is maintained to be constant at the initial battery voltage VB1.

Figure 3:
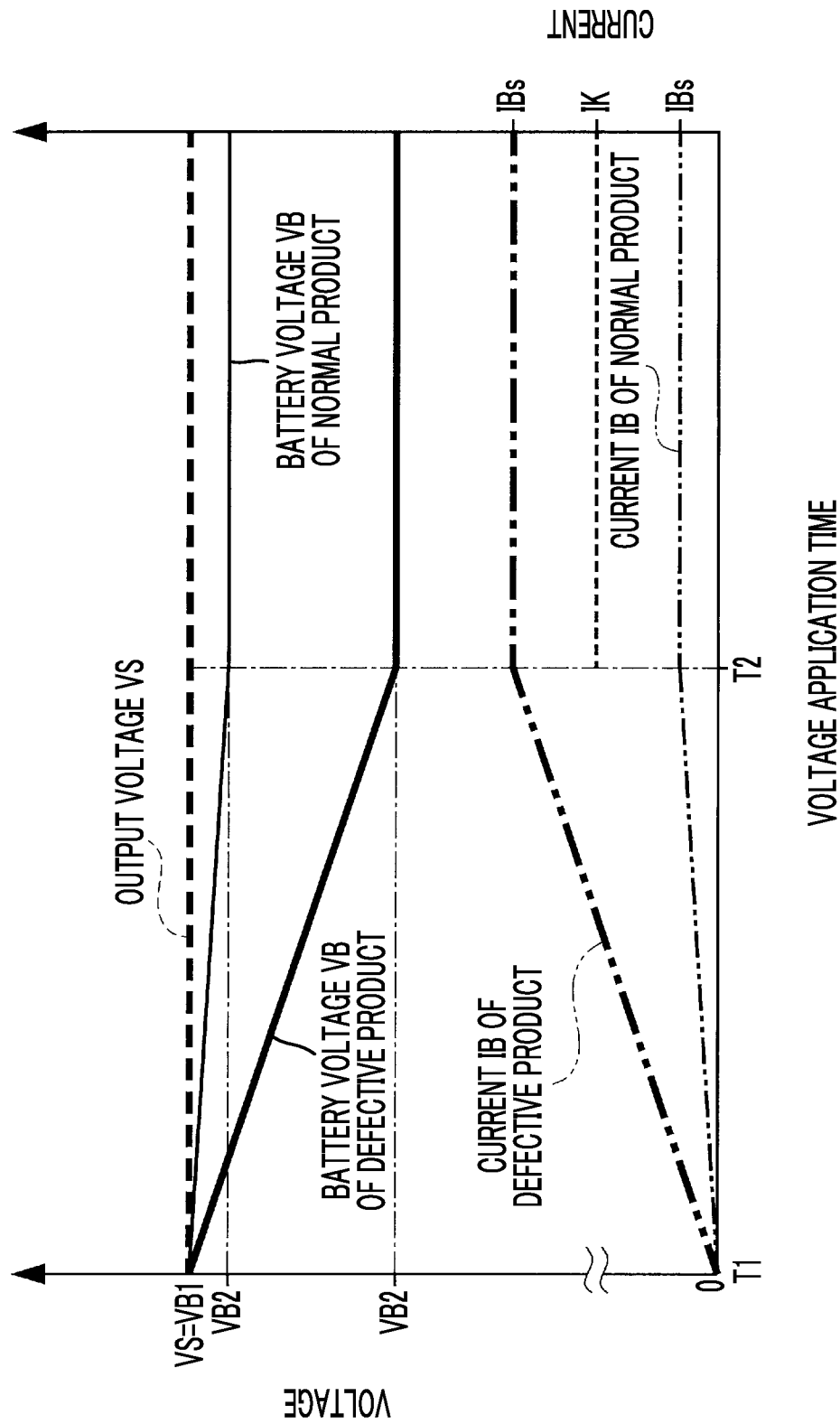
FIG. 3 is a graph illustrating a temporal change in voltage and current in inspection in the embodiment.

The subsequent state of the circuit 3 is illustrated in FIG. 3. In FIG. 3, the horizontal axis denotes time, and the vertical axis denotes a voltage (left side) and a current (right side). On the horizontal axis of time, time T1 at the left end in FIG. 3 is a timing at which application of the output voltage VS equal to the initial battery voltage VB1 is started. After time T1, the battery voltage VB is gradually decreased from the initial battery voltage VB1 due to the self-discharge of the secondary battery 1. Thus, the balance between the output voltage VS and the battery voltage VB is broken, and the circuit current IB flows in the circuit 3. The circuit current IB is gradually increased from zero. The circuit current IB is directly measured by the ammeter 5. When time T2 after time T1 is reached, both the decrease in the battery voltage VB and the increase in the circuit current IB are saturated, and thus, both the battery voltage VB and the circuit current IB become constant (VB2, IBs).

As is apparent from FIG. 3, both the increase in the circuit current IB and the decrease in the battery voltage VB are steeper in a defective secondary battery 1 than in a normal secondary battery 1. Thus, the converged circuit current IBs in the defective secondary battery 1 is higher than the converged circuit current IBs in the normal secondary battery 1. The converged battery voltage VB2 of the defective secondary battery 1 is lower than the converged battery voltage VB2 of the normal secondary battery 1.

The reason why the state of the circuit 3 after time T1 is as illustrated in FIG. 3 will be described. First, the reason for the decrease in the battery voltage VB is the self-discharge of the secondary battery 1 as described above. The self-discharge causes a self-discharge current ID to flow in the electromotive element E of the secondary battery 1. The self-discharge current ID is high when the self-discharge amount of the secondary battery 1 is large, and the self-discharge current ID is low when the self-discharge amount of the secondary battery 1 is small. The self-discharge current ID tends to be high in the secondary battery 1 of which the value of the short-circuit resistance Rp is low.

The circuit current IB that flows after time T1 due to the decrease in the battery voltage VB is a current in the direction of charging the secondary battery 1. That is, the circuit current IB acts in the direction of suppressing the self-discharge of the secondary battery 1 and is in the opposite direction to the self-discharge current ID in the secondary battery 1. When the circuit current IB is increased to be the same as the self-discharge current ID, the self-discharge is stopped substantially. The time when the self-discharge is stopped is time T2. Thus, after time T2, both the battery voltage VB and the circuit current IB become constant (VB2, IBs). A determination as to whether or not the circuit current IB has been converged may be performed using a well-known method. For example, the value of the circuit current IB may be sampled at an appropriate frequency, and a determination that the circuit current IB has been converged may be made when a change in the value of the circuit current IB becomes smaller than a predetermined reference.

As described above, the circuit current IB can be directly acquired as a read value of the ammeter 5. By setting a reference value IK for the converged circuit current IBs, the quality of the secondary battery 1 can be determined. When the converged circuit current IBs is higher than the reference value IK, the secondary battery 1 is a defective product having a large self-discharge amount. When the circuit current IB s is lower than the reference value IK, the secondary battery 1 is a normal product having a small self-discharge amount.

The required processing time (time T1→time T2) in the determination method is shorter than the amount of leaving time in the method described in "BACKGROUND". Since current measurement is performed, the determination accuracy is high. While the output voltage VS is maintained to be constant at the initial battery voltage VB1 in FIG. 3, the required processing time can be further reduced by gradually increasing the output voltage VS from the initial battery voltage VB1 after time T1. The quality determination of the secondary battery 1 using the converged battery voltage VB2 in FIG. 3 is not good means. The reason is that the battery voltage VB may not be accurately obtained as the read value of the voltmeter 6. The basic principle of the inspection method for the secondary battery 1 using the measuring device 2 has been described thus far.

Features of Embodiment

The description has been made such that the reference value IK can be simply set, but actually, a value to be set as the reference value IK depends on various factors. The factors affecting the setting of the reference value IK are exemplified by variations in characteristic depending on manufacturing lots of the positive and negative electrode plates used in the electrode laminate 20, the ambient temperature at the time of current measurement, and the initial battery voltage VB1 at the start of the current measurement. The initial battery voltage VB1 depends on the degree of charging performed in advance, or a situation and the like at the high-temperature aging after charging.

In the embodiment, secondary batteries 1 are grouped such that the secondary batteries 1 having the most similar values of the converged circuit currents IBs of when the secondary battery 1 is a normal product form a group for inspection, and the quality determination of the secondary batteries 1 is performed for each group. Thus, first, the secondary batteries 1 are grouped. The grouping is performed based on the following three rules.

1. Manufacturing Information of Electrode laminate 20
2. Initial Battery Voltage VB1 of Secondary Battery 1
3. Secondary Batteries 1 Inspected on One Inspection Rack The grouping based on "1. Manufacturing Information of Electrode laminate 20" will be described. The manufacturing information of the electrode laminate 20 relates to each manufacturing lot of the positive and negative electrode plates constituting the electrode laminate 20 of the secondary battery 1. Each of the positive and negative electrode plates constituting the electrode laminate 20 is originally manufactured as an oblong original electrode plate. In different original electrode plates, the coating thickness of an electrode active substance layer is slightly different, and the battery characteristics may be affected. Thus, the secondary batteries 1 that use electrode plates originated from different original electrode plates has to belong to different groups. Specifically, the secondary batteries 1 of which each of the positive electrode plates is originated from the same original positive electrode plate and each of the negative electrode plates is originated from the same original negative electrode plate belong to the same group. In each group, the coating thickness of any electrode active substance layer in the positive and negative electrode plates is almost the same in the secondary batteries 1 belonging to the group. In different groups, the coating thickness of the electrode active substance layer may be different.

The grouping based on "2. Initial Battery Voltage VB1 of Secondary Battery 1" will be described. As described above, the initial battery voltage VB1 is the battery voltage VB of the charged secondary battery 1 and is the battery voltage VB at time T1 in the measurement in FIG. 3. The charging before inspection using the measuring device 2 is performed to set the initial battery voltage VB1 to a desired value. However, a certain degree of variations in the initial battery voltage VB1 is caused depending on each secondary battery 1. Variations in the initial battery voltage VB1 affect the converged circuit current IBs of when the secondary battery 1 is a normal product. That is, the converged circuit current IBs of when the secondary battery 1 is a normal product tends to be high when the initial battery voltage VB1 is high, and be low when the initial battery voltage VB1 is low. Thus, when the quality determination of the secondary battery 1 is performed using the same reference value IK regardless of the initial battery voltage VB1 of the secondary battery 1, the determination accuracy cannot be expected to be high.

Figure 4:
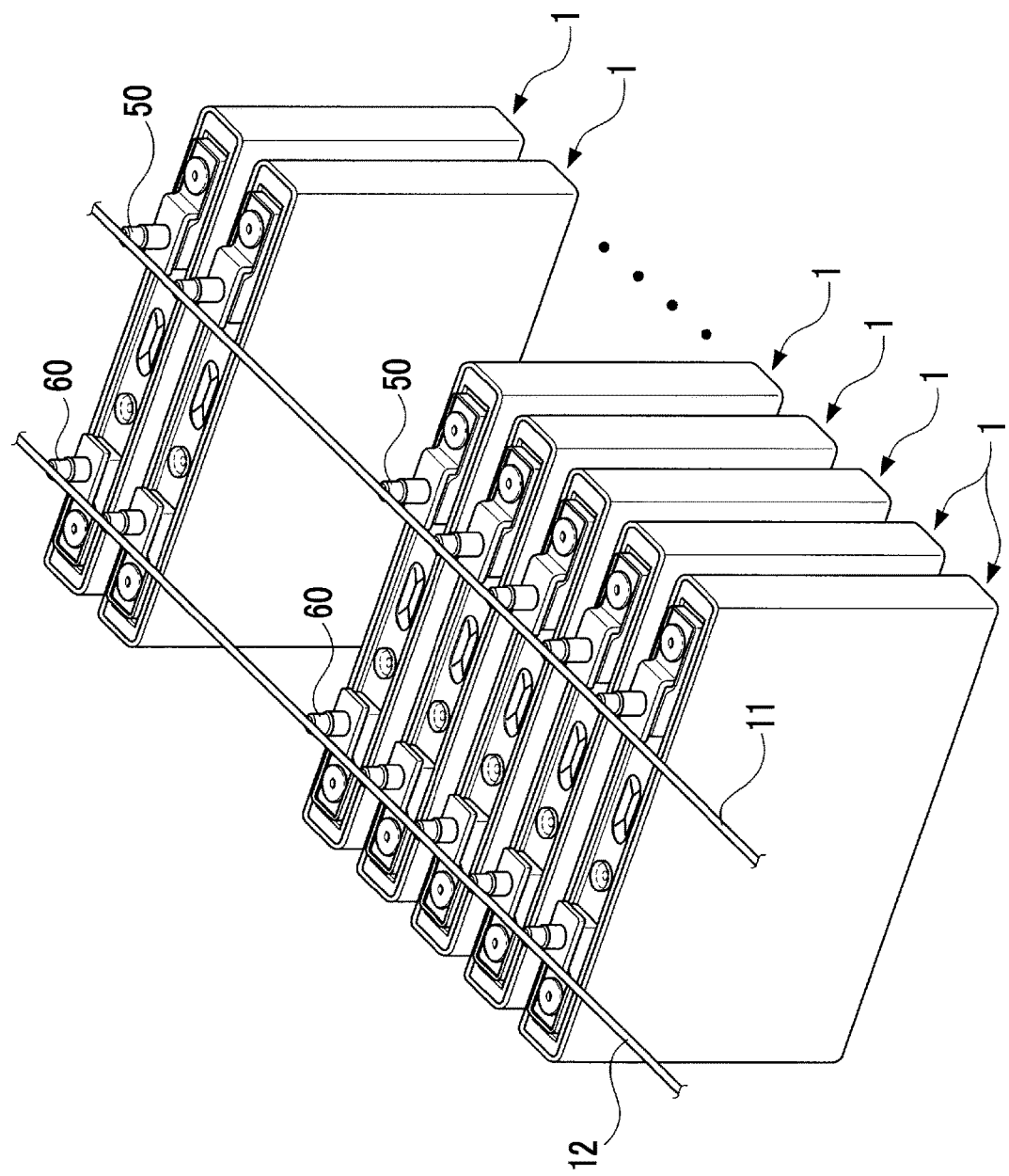
FIG. 4 is a schematic diagram illustrating a situation where secondary batteries are connected to each other in order to equalize a battery voltage.

A plurality of secondary batteries 1 is connected in parallel. That is, as illustrated in FIG. 4, the terminals 50 of the secondary batteries 1 are connected to each other through a busbar 11, and the terminals 60 of the secondary batteries 1 are connected to each other through a busbar 12. Accordingly, the battery voltages VB of the connected secondary batteries 1 are equalized. The equalized battery voltage VB is used as the initial battery voltage VB1. Approximately a few seconds are sufficient to perform the connection for equalizing the battery voltages. The secondary batteries 1 having the equalized initial battery voltage VB1 belong to the same group. In different groups, the initial battery voltage VB1 may be different. When the secondary battery 1 is connected to the measuring device 2 as illustrated in FIG. 1 for the measurement illustrated in FIG. 3, the connection illustrated in FIG. 4 is released. The secondary batteries 1 are individually connected to the measuring device 2.

Figure 5:
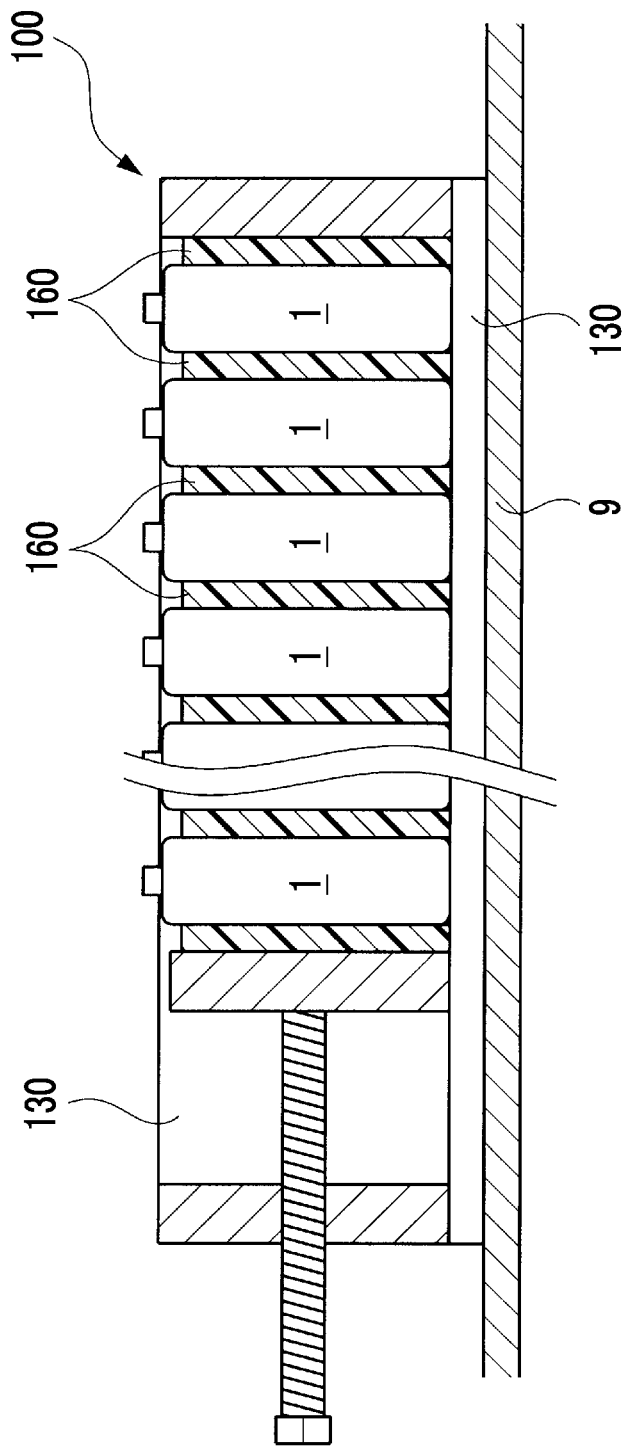
FIG. 5 is a schematic diagram illustrating a situation where a plurality of secondary batteries as an inspection target is loaded on an inspection rack in the embodiment.

The grouping based on "3. Secondary Batteries 1 Inspected on One Inspection Rack" will be described. As illustrated in FIG. 5, the inspection in the embodiment is performed in a state where the target secondary batteries 1 are loaded on an inspection rack 9. The secondary batteries 1 on one inspection rack 9 may be considered to be subjected to the inspection at almost the same ambient temperature. Thus, all secondary batteries 1 belonging to the same group are desirably loaded on the same inspection rack 9 and subjected to the inspection (high-temperature aging and measurement of the self-discharge current ID). Accordingly, all secondary batteries 1 in each group have the same ambient temperature history. In different groups, the ambient temperature history may be different.

In FIG. 5, the secondary batteries 1 on the inspection rack 9 are fastened along with spacers 160 by a fastening member 130 to form one fastened body 100. Each secondary battery 1 in the fastened body 100 is being pressed in its thickness direction (the right-left direction in FIG. 5; the lower right-upper left direction in FIG. 2). A plurality of fastened bodies 100 may be loaded on one inspection rack 9.

The inspection considering the grouping based on the rules is performed as follows. Here, all of the three rules are taken into consideration. First, all target secondary batteries 1 are grouped based on the rule "1. Manufacturing Information of Electrode laminate 20". Next, the secondary batteries 1 are loaded on the inspection rack 9 by considering the grouping based on "1. Manufacturing Information of Electrode laminate 20". That is, the secondary batteries 1 belonging to the same group are loaded on the same inspection rack 9 as far as possible.

When the size of the inspection rack 9 is not large, the secondary batteries 1 belonging to the same group may have to be separately loaded on a plurality of inspection racks 9. In such a case, the group is considered to be subdivided for each inspection rack 9. That is, the grouping is further performed based on the rule "3. Secondary Batteries 1 Inspected on One Inspection Rack". The secondary batteries 1 loaded on one inspection rack 9 can be configured as the fastened body 100 as illustrated in FIG. 5. When the secondary batteries 1 of a plurality of groups based on "1. Manufacturing Information of Electrode laminate 20" are present on one inspection rack 9, it is desirable that the fastened body 100 is configured for each group.

As described above, the charged secondary batteries 1 are s subjected to the high-temperature aging in a state where the secondary batteries 1 are loaded on the inspection rack 9. Thus, the secondary batteries 1 belonging to the same group (based on the rules "1. Manufacturing Information of Electrode laminate 20" and "3. Secondary Batteries 1 Inspected on One Inspection Rack") are considered to be subjected to the high-temperature aging under the same temperature condition. Then, the secondary battery 1 or the fastened body 100 of the secondary batteries 1 is not moved between the inspection racks 9.

Then, the battery voltages VB are equalized as illustrated in FIG. 4. Accordingly, any of the secondary batteries 1 in the group has the same initial battery voltage VB1. The connection for equalizing the battery voltages VB is performed for each group. When all the secondary batteries 1 in one group cannot be currently connected due to the size of each of the busbars 11, 12, the group is divided into a plurality of groups, and then the battery voltages VB are equalized. That is, in such a case, the group is subdivided based on the rule "2. Initial Battery Voltage VB1 of Secondary Battery 1".

Then, the inspection described by the graph in FIG. 3 is executed for each secondary battery 1. The inspection is performed by leaving the secondary battery 1 or the fastened body 100 of the secondary batteries 1 on the inspection rack 9 in a constant temperature room where temperature is managed. Temperature may be slightly different for each inspection rack 9 depending on the position of the inspection rack 9 in the constant temperature room. In this manner, the converged circuit current IBs is acquired for each secondary battery 1. The quality determination of the secondary battery 1 is performed based on the acquired circuit current IBs. It should be noted that a reference for the quality determination of the secondary battery 1 is set for each group unlike the simple comparison between the circuit current IBs and the reference value IK. Specifically, the quality determination of the secondary battery 1 is performed as follows.

A distribution status of the converged circuit currents IBs of the secondary batteries 1 belonging to one group is considered. In a case where all the secondary batteries 1 belonging to the group are normal products, all the converged circuit currents IBs of the secondary batteries 1 belonging to the group are distributed by being concentrated in a narrow range around the circuit current IBs corresponding to the "CURRENT IB OF NORMAL PRODUCT" in FIG. 3. Thus, when a standard deviation of all the circuit currents IBs in the group is denoted by $\sigma IBs$, the value of the standard deviation $\sigma IBs$ is very low. The reason is that all the secondary batteries 1 belonging to the same group have the same positive electrode plates manufacturing lot, the same negative electrode plates manufacturing lot, the same ambient temperature condition until the end of measurement, and the same initial battery voltage VB1 before the start of measurement.

When a defective secondary battery 1 is included in the group, the value of the converged circuit current IBs of the defective secondary battery 1 is high and stands out compared to the circuit current IBs of the normal product. Such a difference is shown by "CURRENT IB OF DEFECTIVE PRODUCT" in FIG. 3. Accordingly, the value of the standard deviation $\sigma IBs$ of the group is high to a certain degree. Thus, the quality determination of the secondary battery 1 belonging to the group can be performed by setting an allowed value $\sigma IBs0$ for the standard deviation $\sigma IBs$. The highest value that may be allowed as the standard deviation $\sigma IBs$ of a group of normal products is set in advance as the allowed value $\sigma IBs0$. When the standard deviation $\sigma IBs$ is calculated for a group, and the value of the standard deviation $\sigma IBs$ is equal to or lower than the allowed value $\sigma IBs0$, any secondary battery 1 belonging to the group is said to be a normal product.

When the value of the standard deviation $\sigma IBs$ is higher than the allowed value $\sigma IBs0$, a defective secondary battery 1 is included in the group. In such a case, the cause of a high value of the standard deviation $\sigma IBs$ is the high circuit current IBs that stands out. Thus, the secondary battery 1 having the standing out circuit current IBs is determined as a defective product. The standard deviation $\sigma IBs$ is calculated again for the circuit currents IBs of the remaining secondary batteries 1 excluding the secondary battery 1 that is determined as a defective product. In a case where the standard deviation σIBs after the defective product is excluded is equal to or lower than the allowed value σIBs0, all the remaining secondary batteries 1 can be determined as normal products. In a case where the standard deviation σIBs after the defective product is excluded is still higher than the allowed value σIBs0, the secondary battery 1 having the highest circuit current IBs is excluded as a defective product, and the exclusion is repeated until the standard deviation σIBs becomes equal to or lower than the allowed value σIBs0.

The calculation of the standard deviation σIBs and the quality determination of the secondary battery 1 based on the standard deviation σIBs are independently performed for each group. The converged circuit current IBs of the normal secondary battery 1 may be different in different groups. The reason is that various conditions described above are different for each group. Thus, when the circuit current IBs of the secondary battery 1 that is a normal product in a certain group is fitted in the distribution of the circuit current IBs in another group, the circuit current IBs of the normal secondary battery 1 may be considered as the circuit current IBs of a defective secondary battery 1. Conversely, when the circuit current IBs of the secondary battery 1 that is a defective product in a certain group is fitted in the distribution of the circuit current IBs in another group, the circuit current IBs of the defective secondary battery 1 may be present in a narrow range where most circuit currents IBs are concentrated. The example described thus far indicates that while the quality determination of the secondary battery 1 cannot be appropriately performed in the simple comparison between the circuit current IB s and the reference value IK, the determination can be appropriately performed in the embodiment.

The determination may be performed using a difference magnitude Δσ in the standard deviation σIBs instead of performing the determination using the comparison between the standard deviation σIBs and the allowed value σIBs0. The difference magnitude Δσ is the absolute value of the difference in the standard deviation σIBs between the whole group and the rest of the group excluding the highest circuit current IBs. When the whole group includes only normal products, the value of the standard deviation σIBs is low, and thus the value of the difference magnitude Δσ is also low. When the group includes a defective product, the value of the standard deviation σIBs is significantly high. The value of the standard deviation σIBs is significantly decreased by excluding the defective product. Thus, the value of the difference magnitude Δσ is high to a certain degree.

The same determination as described above can be performed by setting an allowed value Δσ0 of the difference magnitude Δσ. In a case where the difference magnitude Δσ is equal to or lower than the allowed value Δσ0, all the secondary batteries 1 belonging to the group, including the secondary battery 1 having the highest circuit current IBs, are normal products. In a case where the difference magnitude Δσ is higher than the allowed value Δσ0, at least the secondary battery 1 having the highest circuit current IBs is a defective product. The difference magnitude Δσ is calculated again to perform the determination by regarding the rest of the group from which the defective product is excluded, as a group again.

As described above, the converged circuit current IBs of the normal secondary battery 1 is different in different groups. However, the allowed value σIBs0 for the standard deviation σIBs may be common in all groups. The reason is that the width of variation of the circuit current IBs of the normal product is rarely changed in any group. The allowed value Δσ0 of the difference magnitude Δσ may also be common in all groups. The secondary battery 1 of which the converged circuit current IBs is obviously high may be excluded in advance before the quality determination of the secondary battery 1 is performed using the standard deviation σIBs or the difference magnitude Δσ of the standard deviation σIBs. That is, a significantly high exclusion value Ie may be set, and determination may be performed based on the exclusion value Ie. Then, the quality determination of the secondary battery 1 can be performed using the standard deviation σIBs or the difference magnitude Δσ of the standard deviation σIB s.

Flow of Inspection

A flow of the inspection of the quality of the secondary battery 1 using the method described above will be described using FIG. 6. First, the target secondary batteries 1 are charged (S1). The charging may be performed to set the battery voltage VB of each secondary battery 1 to the desired value without considering grouping. Grouping is performed based on the manufacturing information (S2). The grouping is grouping based on the rule "1. Manufacturing Information of Electrode laminate 20". The secondary batteries 1 are fastened by the fastening member 130 and loaded on the inspection rack 9 (S3). In this manner, the groups may be subdivided based on the rule "3. Secondary Batteries 1 Inspected on One Inspection Rack". Then, the high-temperature aging is performed (S4). It should be noted that the high-temperature aging is a typical process and may not be performed.

Then, the battery voltages VB are equalized (connection through the busbars 11, 12) (S5). In this manner, the groups may be subdivided based on the rule "2. Initial Battery Voltage VB1 of Secondary Battery 1". Then, the measurement illustrated in FIG. 3 using the measuring device 2 is performed, and the converged circuit current IBs of each secondary battery 1 is acquired (S6). The process including actual operations for the secondary battery 1 has been described thus far, and the subsequent process is a process of calculation and comparison for the quality determination of the secondary battery 1.

First, pre-exclusion is performed (S7). That is, as described above, the secondary battery 1 of which the acquired converged circuit current IBs is obviously higher than the others is excluded as a defective product from the group. The exclusion value Ie for the exclusion is a value that is acquired by adding a predetermined slightly high value to the average value (or the center value or the like) of the circuit current IBs of each group. For example, the "predetermined slightly high value" may be a value that is approximately three or four times the allowed value σIBs0. Performing the pre-exclusion has an advantage of slightly reducing a calculation load in the calculation of the standard deviation σIBs in S8. It should be noted that the process of the pre-exclusion may not be performed.

The standard deviation σIBs is calculated for each group (S8). The calculated standard deviation σIBs is compared with the allowed value σIBs0 (S9). In a case where the standard deviation σIBs is equal to or lower than the allowed value σIBs0, a determination "OK" is made, and all the products in the group are determined as normal products (S11). In a case where the standard deviation σIBs is higher than the allowed value σIBs0, a determination "NG" is made. In such a case, the secondary battery 1 having the highest circuit current IBs in the group is excluded as a defective product from the group (S10). The rest of the group excluding the defective product is regarded as a group again, and the process from S8 is repeated.

When the determination is performed using the allowed value $\Delta\sigma 0$ of the difference magnitude $\Delta\sigma$ instead of using the allowed value $\sigma IBs0$ of the standard deviation $\sigma IB$ s, two standard deviations $\sigma IBs$ and the difference magnitude $\Delta\sigma$ of the two standard deviations $\sigma IBs$ are calculated in S8. The difference magnitude $\Delta\sigma$ is compared with the allowed value $\Delta\sigma 0$ of the difference magnitude $\Delta\sigma$ in S9. The process other than S8 and S9 is the same as described above.

As described in detail thus far, according to the embodiment, the measuring device 2 is connected to the secondary battery 1 to apply an external voltage to the secondary battery 1 in an reverse direction. The quality determination of the secondary battery 1 is performed based on the converged value of the circuit current IBs in the connected state. Accordingly, compared to a case where the determination is performed using the amount of decrease in the battery voltage VB, the time taken for processing is reduced, and the determination accuracy is improved. In the embodiment, the secondary batteries 1 having similar values of the converged circuit current IBs of when the secondary battery 1 is a normal product are grouped, and the quality determination of each secondary battery 1 is performed for each group. Accordingly, the determination accuracy is further increased. Therefore, the quality determination of the secondary battery 1 can be promptly performed regardless of variations in conditions, and an inspection method for a secondary battery is implemented.

A manufacturing method for a secondary battery that has the features of the inspection method for a secondary battery in the embodiment is implemented by charging a new assembled non-charged secondary battery 1 to a predetermined charging state for the first time to acquire the charged secondary battery 1, and inspecting the charged secondary battery 1 using the inspection method. The assembly of the secondary battery 1 includes accommodating the electrode laminate 20 in the exterior body 10 (refer to FIG. 2), introducing a liquid electrolyte in the exterior body 10, and making the exterior body 10 airtight.

The embodiment is merely an illustration, and the disclosure is not limited thereto. Accordingly, various improvements and modifications can be carried out to the disclosure without departing from the gist of the disclosure. For example, in the embodiment, when the target secondary batteries 1 are grouped, all of the three rules "1. Manufacturing Information of Electrode laminate 20" to "3. Secondary Batteries 1 Inspected on One Inspection Rack" are taken into consideration in the end. However, all of the three rules do not have to be considered. In a case where grouping is performed by considering at least one of the three rules, the determination can be performed with higher accuracy compared to the case of using the simple comparison between the circuit current IBs and the reference value IK.

In the embodiment, for the equalization of the initial battery voltages VB1 which is the rule "2. Initial Battery Voltage VB1 of Secondary Battery 1", the target secondary batteries 1 are fastened in parallel with each other, and then the initial battery voltages VB1 thereof are forcedly equalized. However, the disclosure is not limited to such a method. A method of measuring the initial battery voltage VB1 of each secondary battery 1 and grouping the secondary batteries 1 having the most similar values of the initial battery voltage VB1 may also be used. In such a case, the initial battery voltage VB1 can be measured in a state where the direct current electric power supply 4 is switched off in the measuring device 2 in FIG. 1. The initial battery voltage VB1 can also be measured using a general voltmeter.

In such a case, it should be noted that a measurement method that is not affected by the difference in contact resistance between terminals depending on each secondary battery 1 has to be used. For example, when the initial battery voltage VB1 is measured by a voltmeter, two read voltage values are acquired in a state where a resistor is disposed in parallel with the voltmeter and a state where a resistor is not disposed, and the contact resistance can be calculated from both read values and a resistance value of the resistor. Accordingly, the initial battery voltage VB1 after the influence of the contact resistance is canceled can be calculated. The grouping may be performed after each acquired initial battery voltage VB1 is distributed on the scale of a narrow voltage range, for example, approximately 0.01 V. Accordingly, the initial battery voltages VB1 of the secondary batteries 1 in a group can be almost equalized.

While the standard deviation $\sigma IBs$ (or its difference magnitude $\Delta\sigma$) of the converged circuit current IBs is used as an indicator in the quality determination of the secondary battery 1 in the embodiment, the indicator is not limited to the standard deviation. Any indicator value (or its difference magnitude) such as a mean deviation and a variance indicating the degree of variation may be used instead of the standard deviation.

Figure 6:
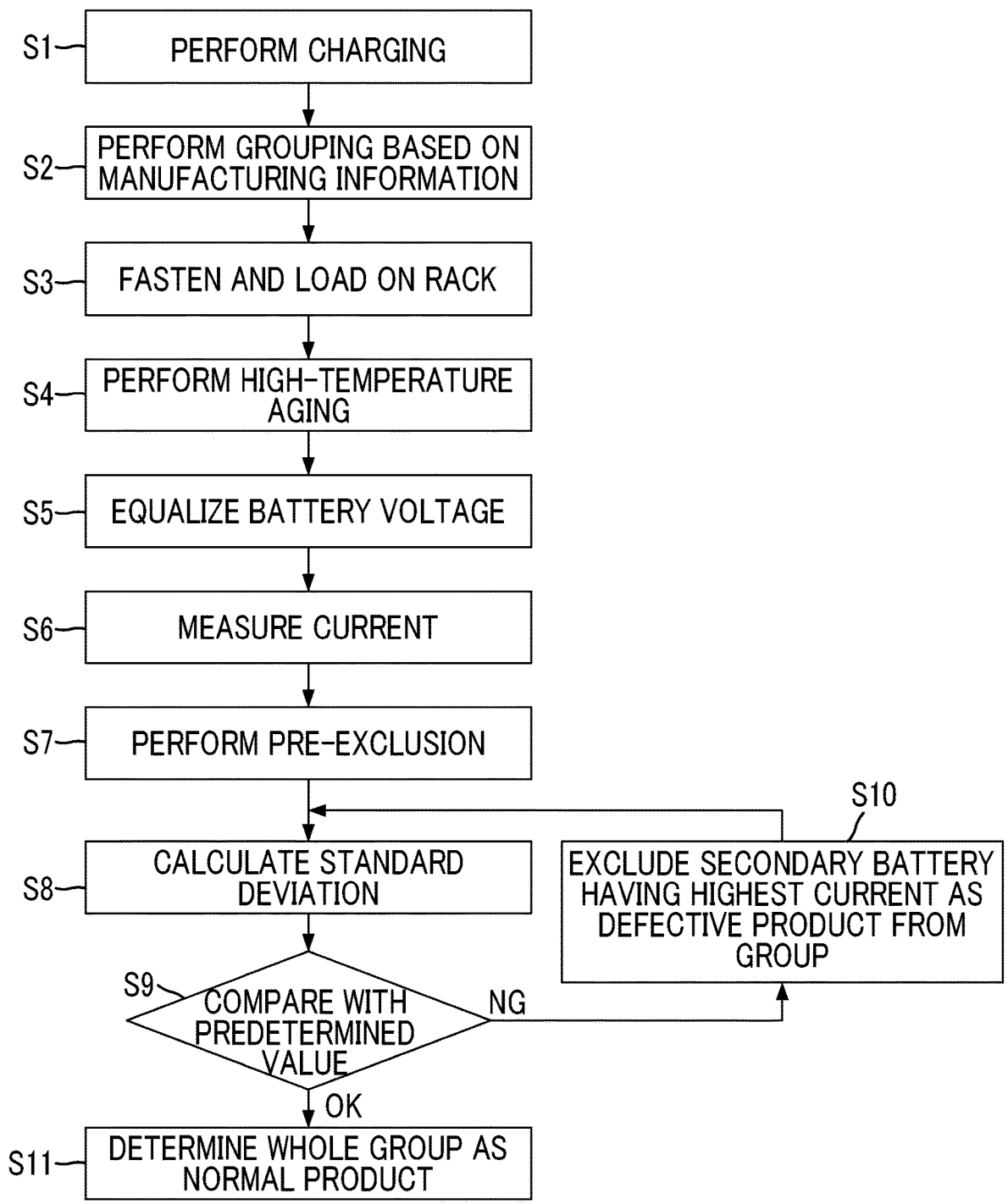
FIG. 6 is a flowchart illustrating a procedure of the inspection method for the secondary battery in the embodiment.

In the flowchart in FIG. 6, in addition to the allowed value $\sigma IBs0$, a limit value may be set for the standard deviation $\sigma IBs$ for S8 that is performed for the first time. The limit value is set to a significantly higher value than the allowed value $\sigma IBs0$. When the calculated standard deviation $\sigma IBs$ exceeds the limit value, all secondary batteries 1 in the group are immediately determined as defective products without performing the process after S9. The determination based on the limit value is basically performed using the standard deviation $\sigma IBs$ even when the difference magnitude $\Delta\sigma$ is used in determination. In S10 in FIG. 6, a minimum number may be set for the number of secondary batteries 1 in the group from which the defective product is excluded. When the number of secondary batteries 1 is less than the minimum number, all the secondary batteries 1 in the group are determined as defective products. The reason is that when the number of secondary batteries 1 in the group is significantly decreased, the reliability of the standard deviation (or an indicator instead of the standard deviation) is decreased.

The inspection method of the embodiment can be used not only for a secondary battery that is just manufactured as a new product, but also for a used secondary battery for remanufacturing and the like using a used assembled battery. The electric power storage device as a determination target is not limited to a secondary battery and may be a capacitor such as an electric double-layer capacitor and a lithium ion capacitor.

What is claimed is:

1. An inspection method for an electric power storage device, the inspection method comprising:
   current measuring of i) connecting an external electric power supply to a charged electric power storage device in a reverse voltage direction to form a circuit, ii) adjusting a voltage of the external electric power supply such that a current does not flow in the circuit immediately after the connection, and iii) then, acquiring a converged current value of the current flowing in the circuit;
   quality deciding of deciding a quality of the electric power storage device based on the converged current value acquired in the current measuring; and grouping a target electric power storage device based on a rule that the converged current value of when the target electric power storage device is a normal product is constant in a group, the grouping being performed before the quality deciding, wherein the quality deciding includes
- variation calculating of calculating a degree of variation in the converged current value for each group, and
- determining, in a case where the calculated degree of variation of a group is equal to or lower than a predetermined level, any electric power storage device belonging to the group as a normal product, and determining, in a case where the degree of variation of a group exceeds the predetermined level, at least one electric power storage device having the highest converged current value in the group as a defective product.

2. The inspection method according to claim 1, wherein:
the grouping is performed before the current measuring; and
the grouping is performed based on a voltage value of the electric power storage device before start of the current measuring.

3. The inspection method according to claim 2, wherein the grouping is performed by connecting positive terminals of a plurality of electric power storage devices to each other and negative terminals of the electric power storage devices to each other, performing an initial voltage equalization process of equalizing the voltage values of the connected electric power storage devices, and forming a group of the electric power storage devices of which the voltage values are equalized by the initial voltage equalization process.

4. The inspection method according to claim 1, wherein:
the grouping is performed before the current measuring; and
in the grouping,
- a plurality of target electric power storage devices is loaded on each of inspection racks,
- the electric power storage devices on the same inspection rack are grouped,
- then, the electric power storage devices are not moved between the inspection racks, and
- the current measuring is performed in a state where the electric power storage devices are loaded on each inspection rack for each group.

5. The inspection method according to claim 1, wherein:
the electric power storage device that incorporates a positive electrode plate and a negative electrode plate is set as an inspection target; and
the grouping is performed by forming a group of electric power storage devices such that the positive electrode plates of the electric power storage devices in the group belong to the same positive electrode plate manufacturing lot and the negative electrode plates of the electric power storage devices in the group belong to the same negative electrode plate manufacturing lot.

6. The inspection method according to claim 1, wherein:
in the determining, in a case where the degree of variation of a group exceeds the predetermined level, an electric power storage device having the highest converged current value in the group is determined as a defective product, and the electric power storage device is excluded from the group; and
in the quality deciding, the variation calculating and the determining are repeated.

7. A manufacturing method for an electric power storage device, the manufacturing method comprising:
charging an assembled non-charged electric power storage device to a predetermined charging state for a first time to acquire a charged electric power storage device; and
inspecting the charged electric power storage device,
wherein in the inspecting of the charged electric power storage device, the inspection method according to claim 1 is performed.

* * * * *